US006281967B1

(12) United States Patent
Kudo

(10) Patent No.: US 6,281,967 B1
(45) Date of Patent: Aug. 28, 2001

(54) ILLUMINATION APPARATUS, EXPOSURE APPARATUS AND EXPOSURE METHOD

(75) Inventor: Yuji Kudo, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/526,216

(22) Filed: Mar. 15, 2000

(51) Int. Cl.[7] .......................... G03B 27/54; G03B 27/42; G03B 27/72; G03L 5/04; A61N 5/00
(52) U.S. Cl. .................. 355/67; 355/53; 355/71; 355/77; 430/396; 250/492.2; 250/492.22
(58) Field of Search .................. 355/67, 53, 71, 355/77; 430/396; 250/492.2, 492.22

(56) References Cited

U.S. PATENT DOCUMENTS

| | | | |
|---|---|---|---|
| 4,918,583 | * | 4/1990 | Kudo et al. ............ 362/268 |
| 5,646,715 | | 7/1997 | Wangler . |
| 5,675,401 | * | 10/1997 | Wangler et al. ......... 355/67 |
| 5,815,248 | * | 9/1998 | Nishi et al. ............ 355/71 |
| 6,127,095 | * | 10/2000 | Kudo ................... 430/311 |

* cited by examiner

Primary Examiner—Russell Adams
Assistant Examiner—Khaled Brown
(74) Attorney, Agent, or Firm—Finnegan, Henderson, Farabow, Garrett & Dunner, L.L.P.

(57) ABSTRACT

An object of the invention is to provide an illumination apparatus and exposure apparatus and method employing this, whereby the illumination distribution on a mask or wafer can be compensated to a desired distribution, and whereby it is possible to independently alter the pupil shape (coherence factor) of illuminating light in respect of various image heights above the wafer.

In order to achieve the on object, an illumination apparatus as claimed in the invention is provided with: a rod-type optical integrator forming a large number of light source images from the light from a light source; a relay optical system that illuminates a surface to be illuminated by respectively condensing light from the large number of light source images formed by the rod-type optical integrator; and means for controlling illumination that respectively independently control the intensity distribution of the light in the large number of light source images, being arranged on the light source side of the rod-type optical integrator.

9 Claims, 13 Drawing Sheets

TWO-DIMENSIONAL LIGHT SOURCE
VIRTUAL IMAGES FORMED BY
REFLECTION

ILLUMINATION APPARATUS, EXPOSURE APPARATUS AND EXPOSURE METHOD

FIELD OF THE INVENTION

The present invention relates to an illumination apparatus and exposure apparatus and method employing this to form a desired illumination distribution by condensing light from a light source, and in particular relates to an illumination apparatus etc. that is ideal for illumination of a mask for exposing minute semiconductor circuitry on a photosensitive substrate.

BACKGROUND OF THE INVENTION

Conventionally, in illumination apparatus of this type, a plurality of secondary light sources are formed by for example a rod-type optical integrator, and uniform illumination of a mask on which is described a circuit pattern is performed by utilizing the illumination from these secondary light sources. The illuminated circuit pattern is projected onto and exposes a wafer coated with photosensitive material, through a projection lens.

Recently also, attention has been attracted by a technique for improving the resolving power and depth of focus of the optical projection system of the exposure apparatus by altering the pupil shape of the illumination light by changing the shape of aperture stops which are arranged in conjugate positions of the two-dimensional light source, in accordance with the shape of the pattern that is projected onto the wafer.

In an illumination device as above, it is generally considered that the illumination distribution on the mask i.e. the illumination distribution on the wafer when no pattern is formed on the mask should be in a uniform condition; however, due to various causes such as contamination or eccentricity of the optical system or unevenness of the anti-reflective coating, if non-uniformity of the illumination distribution on the wafer is found, more precise exposure can be achieved by adjusting the illumination distribution so as to compensate for this. Furthermore, in some cases, better results are obtained by deliberately providing a distribution of the illumination on the wafer, depending on the shape of the pattern on the mask, and/or aberration of the projection lens, or the pupil shape of the illuminating light etc.

Likewise, although it is generally considered that the pupil shape of the illuminating light should be the same shape for all image heights on the wafer, sometimes better results are obtained by deliberately arranging for different pupil shapes for different image heights.

SUMMARY OF THE INVENTION

Accordingly, an object of the present invention is to provide an illumination apparatus and exposure apparatus and method using this whereby the illumination distribution on the mask or wafer can be compensated to a desired distribution, and wherein the pupil shape (coherence factor) of the illuminating light can be independently altered for various image heights on the wafer.

In order to solve the above problem, an illumination apparatus as claimed in the invention comprises: a rod-type optical integrator forming a large number of light source images from the light from a light source; a relay optical system that illuminates a surface to be illuminated, by respectively condensing light from said large number of light source images formed by the rod-type optical integrator; and illumination control means that respectively independently control the intensity distribution of the light in the large number of light source images, being arranged on the light source side of the rod-type optical integrator.

Since, with the illumination apparatus described above, the optical intensity distributions at a large number of light source images are respectively independently controlled by illumination control means arranged on the light source side of a rod-type optical integrator, the condition of the light that is supplied to the illuminated surface from the light source images can be easily and precisely controlled. Consequently, illumination conditions such as the illumination distribution and/or the pupil shape over the illuminated surface can be regulated to the desired condition. In this context, the meaning of the term "optical intensity distribution" includes both changing the absolute quantity of the intensity and changing the distribution condition.

Also, in a preferred mode, a condensing optical system that directs light through the illumination control means to the rod-type optical integrator is arranged between the illumination control means and the rod-type optical integrator; the illumination control means include an optical filter that controls the transmittance distribution of the light from the large number of light source images respectively independently; and the optical filter is provided in a position that is substantially optically conjugate with the surface to be illuminated, in relation to the condensing optical system, the rod-type optical integrator and relay optical system.

With the illumination apparatus described above, light corresponding to a large number of light source images has its transmittance distribution respectively individually adjusted by passing through the optical filter of the illumination control means, and is easily individually input to the rod-type optical integrator by the condensing optical system, so adjustment of the illumination condition at the surface to be illuminated is easy.

An exposure apparatus as claimed in the invention comprises: a rod-type optical integrator forming a large number of light source images from the light from a light source; a relay optical system that illuminates a mask, by respectively condensing light from the large number of light source images formed by the rod-type optical integrator; a projection system that projects the pattern of the mask onto a photosensitive substrate; and illumination control means that respectively independently control the intensity distribution of the light in the large number of light source images, being arranged on the light source side of the rod-type optical integrator.

With an exposure apparatus as described above, since the illumination control means respectively independently controls the intensity distribution of the light in a large number of light source images, being arranged on the light source side of the rod-type optical integrator, illumination conditions over the surface to be illuminated, such as the illumination distribution and/or the pupil shape, can be adjusted to the desired conditions, making it possible to achieve exposure which is more precise and matches the circumstances.

A method of exposure as claimed in the invention comprises: an optical control step wherein the intensity distribution of the light in a large number of light source images on the light source side of a rod-type optical integrator is independently controlled using this rod-type optical integrator, which forms a large number of light source images from the light from a light source; a step of illuminating a mask by respectively condensing light from the large number of light sources whose optical intensity distribution is respectively independently controlled by this optical control step; and an exposure step of exposing the pattern of the mask onto a photosensitive substrate.

With this exposure method, in the optical exposure step, the optical intensity distribution of the large number of light source images is respectively independently controlled at the light source side of the rod-type optical integrator, so illumination conditions over the surface to be illuminated such as the illumination distribution and/or pupil shape can be adjusted to the desired condition, enabling exposure to be achieved which is more precise and in accordance with the circumstances.

DESCRIPTION OF THE PREFERRED EMBODIMENTS

[First embodiment]

Figure 1:
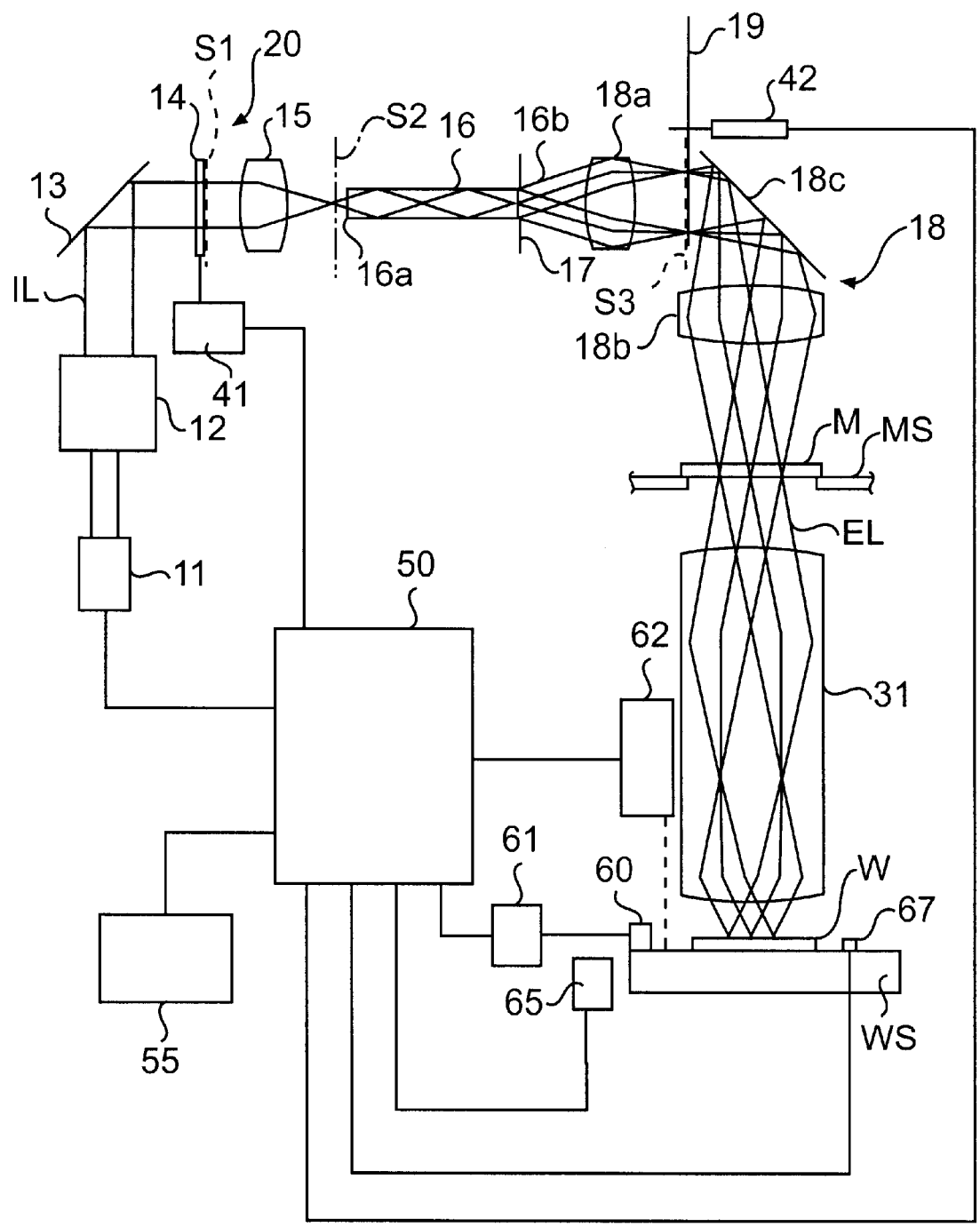
FIG. 1 is a diagram given in explanation of the arrangement of an exposure apparatus as claimed in the first embodiment.

FIG. 1 is a diagram given in explanation of the general arrangement of an exposure apparatus as claimed in a first embodiment of the invention.

First of all, a simple explanation will be given of the essentials of the optical system of the illuminating light for illuminating mask M. The illumination light from a light source 11 is passed through beam shaping optical system 12 to provide a practically parallel beam, which is reflected by reflecting mirror 13, and, passing through an illumination control device 20 constituting illumination control means comprising a filter 14 and condensing lens 15, is directed onto a rod-type optical integrator (hereinbelow referred to as an integrator) 16.

The optical flux from a large number of secondary light sources formed by this integrator 16 is restricted by a variable field of view stop 17 and is then projected by a relay optical system 18 with a desired magnification factor and numerical aperture (NA) onto the mask M of a mask stage MS. In this way, the illumination region on mask M is illuminated practically uniformly in overlapping fashion by the secondary light sources. A reflecting mirror 18c for bending the optical path is arranged between front group 18a and rear group 18b of relay optical system 18, and a turret plate 19 having a plurality of apertures of different shape and/or size is arranged between reflecting mirror 18c and front group 18a. Turret plate 19 constitutes variable aperture means which appropriately adjust the aperture shape at the pupil position of the illumination optical system.

The image of the circuit pattern on mask M that is illuminated by illuminating light IL from the illuminating optical system described above constitutes exposure light EL consisting of illuminating light IL that has passed through mask M and is projected with reduced size onto a wafer W placed on a wafer stage WS, by means of the projection optical system 31, and, as a result of the photosensitive action of the resist which covers wafer W, the circuit pattern image on mask M is transferred onto wafer W.

Details of the various parts of the exposure apparatus illustrated in FIG. 1 will now be described. The light source 11 comprised by the illumination optical system directs illumination light IL of the photosensitive wavelength of the resist covering wafer W thereonto as a practically parallel optical flux. The illumination light from source 11 is shaped to an illumination beam of prescribed cross-sectional shape by beam shaping optical system 12, and is input to illumination control device 20 through reflecting mirror 13. This illuminating light can be for example a laser pulse; in this case, the emission timing is regulated by a trigger pulse that is output from a controller 50. The front-stage filter 14 comprised by illumination control device 20 is equipped with a plurality of filter elements provided in a number corresponding to the number of secondary source images, as will be described in detail later, and is arranged perpendicular to the optic axis in the vicinity of a conjugate plane S1 that is conjugate with mask M i.e. wafer W. Rear-stage condensing lens 15 is arranged in a position separated from the position of virtual image plane S2 of the secondary light source formed by integrator 16 by the amount of the focal point distance, so that the illuminating light IL that is output from filter 14 practically parallel with the optical axis is first made to converge on this virtual image plane S2.

Driven by an actuator 41 under the control of a controller 50, filter 14 is capable of being displaced in the direction perpendicular to the direction of the illuminating light, so that it can be retracted from the optical path of the illumination optical system in accordance with conditions such as the pattern of mask M that is to be transferred to wafer W.

Input face 16a of integrator 16 is arranged in the vicinity of virtual image plane S2. The illumination light IL that is made to converge by condensing lens 15 is input into integrator 16 from input face 16a, and is output from output face 16b after being reflected a prescribed number of times on the inside surface of integrator 16. The illumination light IL that is output from integrator 16 is output from an output plane as if from a virtual image of discrete secondary light sources corresponding to the number of times of reflection. Consequently, the angle of the illumination light that is output from output plane 16b corresponds to the output angle of the illumination light IL from the virtual image of the secondary light sources arranged on virtual image plane S2.

Figure 2:
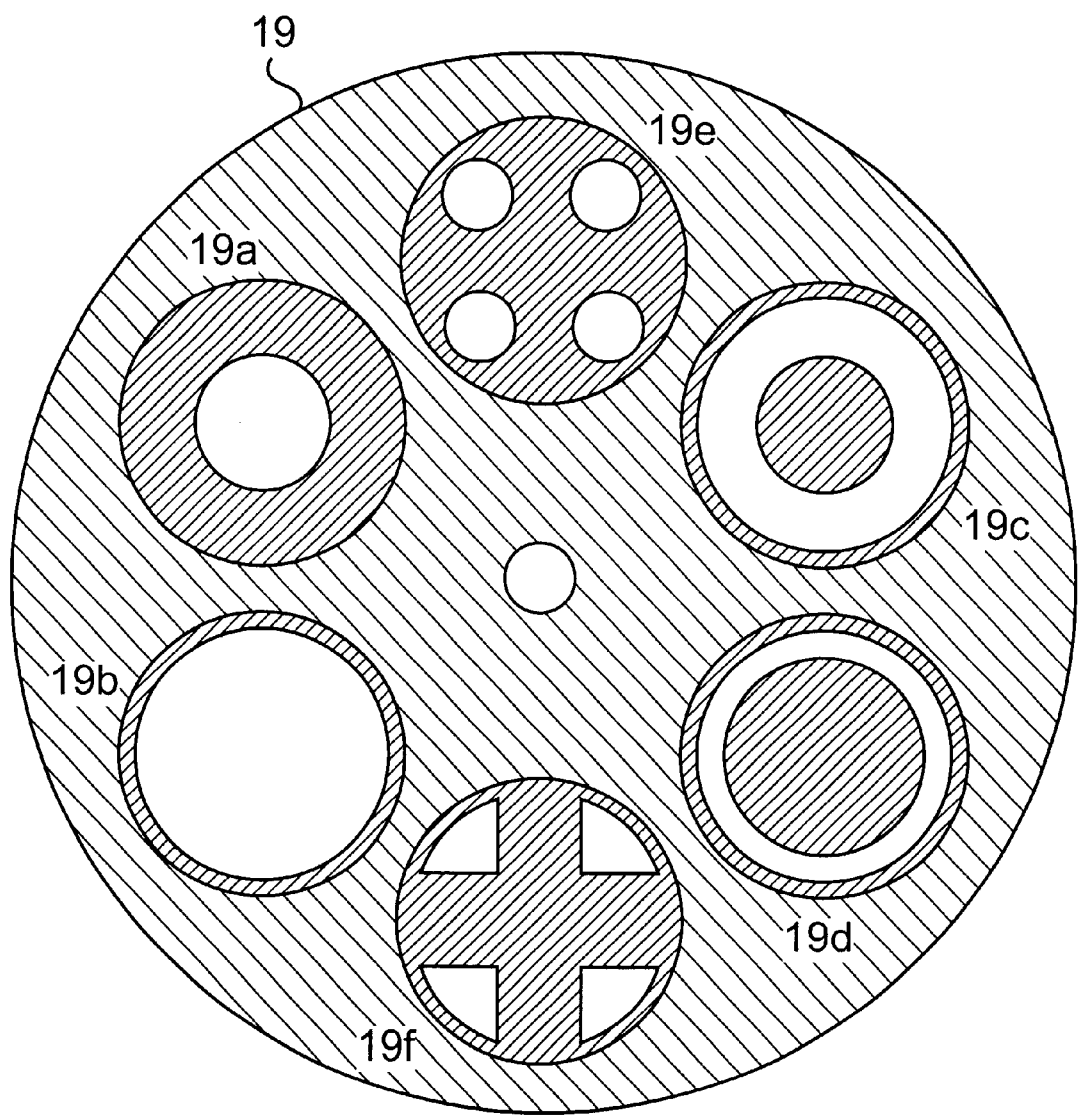
FIG. 2 is a view given in explanation of a turret plate for changing the aperture stop of the illuminating optical system.

Turret plate 19 is capable of regulating at least either shape or size of the two-dimensional light sources, and is arranged in the vicinity of real image plane S3 that is formed by the large number of secondary light source images by the front group 18a. As shown in FIG. 2, this turret plate 19 consists of a transparent quartz substrate that is formed with a plurality of aperture stops 19a to 19f mutually differing in respect of at least either shape or size. Of these, the two aperture stops 19a, 19b having circular apertures serve for varying the σ value etc.; the aperture stops 19c, 19d are stops having apertures of mutually different annular ratio (ratio of the internal diameter and external diameter of the annular aperture); while the remaining aperture stops 19e, 19f are stops having four eccentric apertures for forming four eccentric secondary light sources.

This turret plate 19 is arranged on the optical path of the illuminating light IL with a single aperture stop selected in accordance with the pattern of mask M to be transferred onto wafer W by suitable rotation driven by motor 42 controlled by controller 50.

Mask M is arranged in practically a conjugate position with respect to the output plane 16b of integrator 16 on the other side of relay optical system 18 as described above, and is thus arranged in a practically conjugate position with respect to filter 14. Also, wafer W is arranged in a conjugate position with respect to mask M, on the other side of projecting optical system 31.

Wafer stage WS is provided with a position detection device 61 comprising for example a laser interferometer that monitors displacement of a disposable mirror 60 provided on wafer stage WS, and an alignment optical system 62 to make it possible to align wafer W and mask M. A drive device 65 that performs three-dimensional drive of wafer stage WS is controlled by a controller 50, so as to drive wafer stage WS into the desired position in accordance with the output of position detection device 61 and alignment optical system 62.

Figure 3:
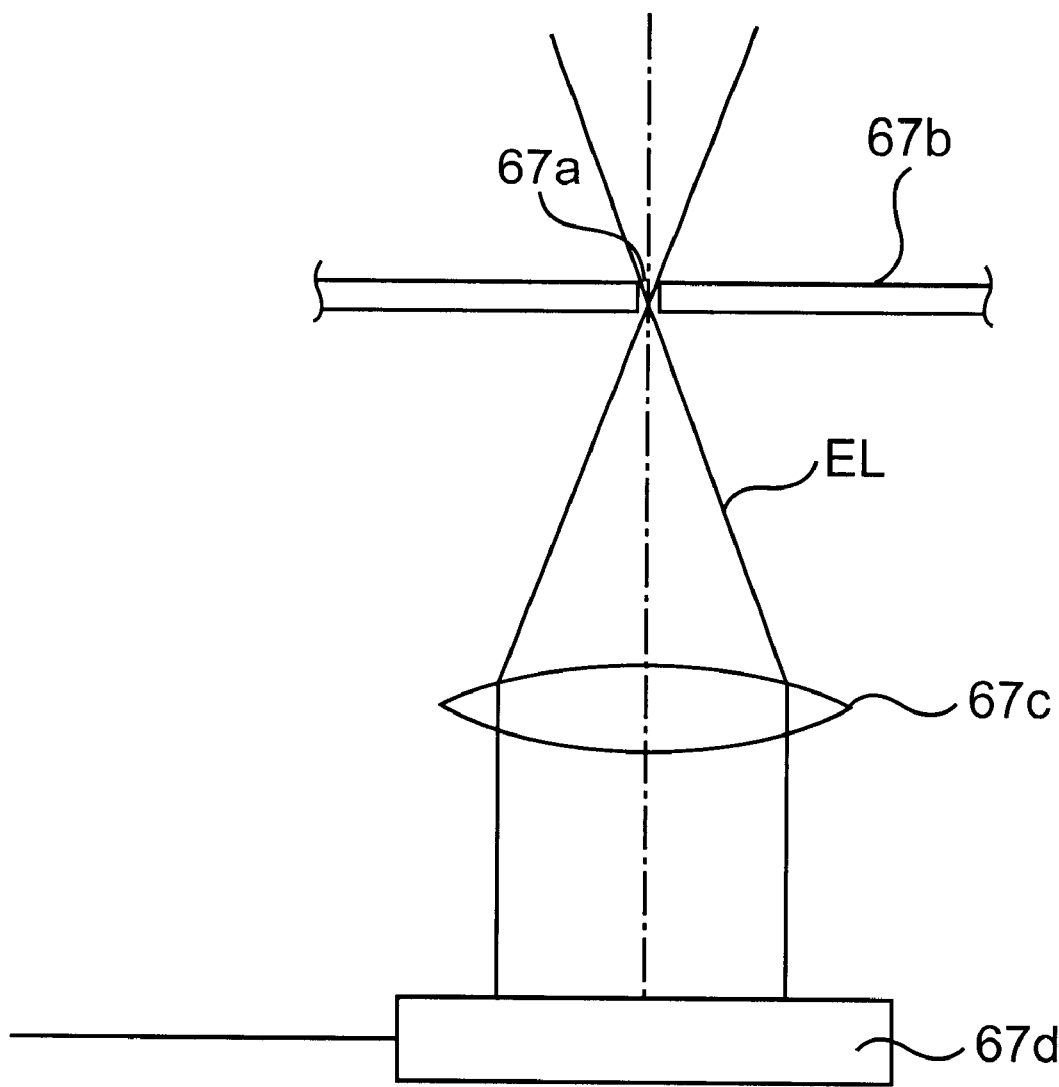
FIG. 3 is a cross-sectional constructional view given in explanation of a device for detecting illumination distribution.

Also, wafer stage WS is provided with an illumination sensor 67 for measuring the degree of illumination and/or pupil shape of the illuminating light. As shown in FIG. 3, this illumination sensor 67 comprises: an upper plate 67b having a pinhole 67a arranged at the height of the upper surface of wafer W i.e. the image-forming plane of projection optical system 31; a lens 67c arranged in a position separated from pinhole 67a by the distance of the focal point; and a CCD 67d that detects the light from pinhole 67a through lens 67c. A diffraction pattern corresponding to the cyclic pattern on mask M is projected onto CCD 67d by displacing illumination sensor 67 right under projection optical system 31, by suitably displacing wafer stage WS. By analyzing the output of CCD 67d and comparing it with previously stored data, the pattern on mask M can be to a certain extent identified, and the type of mask on mask stage MS ascertained. Also, if illumination sensor 67 is displaced within the range of the exposure region of projecting optical system 31 by removing mask M from mask stage MS and suitably displacing wafer stage WS, an amount of light corresponding to the degree of illumination at each point on wafer W can be projected onto CCD 67d. That is, the illumination distribution on wafer W can be obtained by detecting how the total etc. of the outputs of CCD 67d vary in accordance with the image height of wafer W. Furthermore, a brightness distribution corresponding to the pupil shape at each point on wafer W is formed on CCD 67d. That is, the pupil shape at each image height on wafer W can be detected by detecting how the distribution of the output of CCD 67d changes with image height of wafer W.

The operation of the exposure apparatus of FIG. 1 i.e. the data or instructions necessary for operation of controller 50 can be input from outside through an input device 55.

Figure 4:
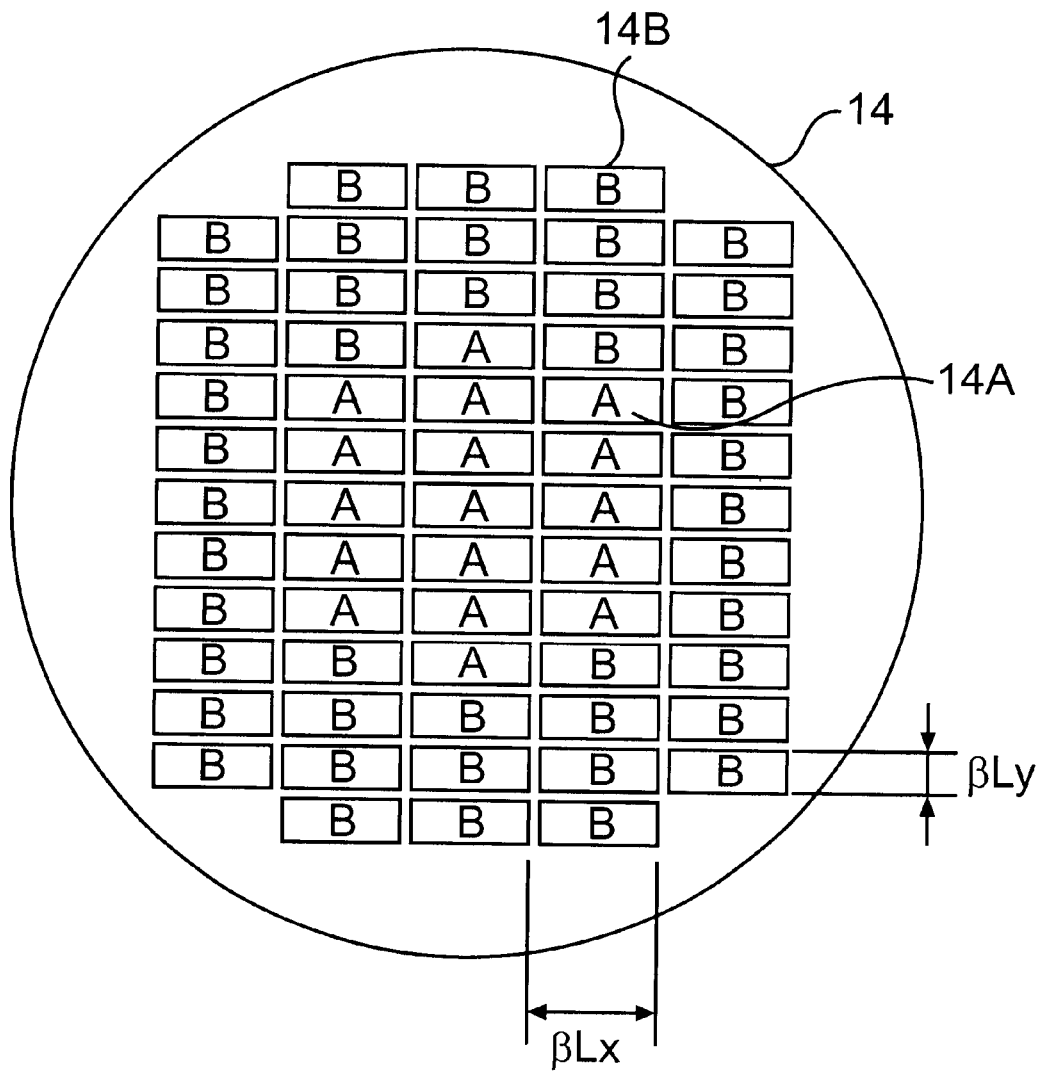
FIG. 4 is a view given in explanation of the construction of a filter constituting illumination control means.

FIG. 4 is a view to a larger scale given in explanation of the construction of filter 14 which is arranged in the vicinity of conjugate plane S1. Rectangular filter patterns 14A, 14B are arranged at the surface of this filter 14. These filter patterns 14A, 14B have characteristic transmissivity distributions, the transmissivity distribution characteristics being different for the middle filter patterns 14A and the peripheral filter patterns 14B. In the Figure, for ease of understanding, the symbol A is placed at the positions of the former filter patterns 14A, while the symbol B is placed at the position of the latter filter patterns 14B, so as to clarify the arrangement of these two types of filter patterns 14A and 14B. Filter patterns 14A, 14B respectively correspond to the plurality of two-dimensional light sources formed by integrator 16.

Figure 5A:
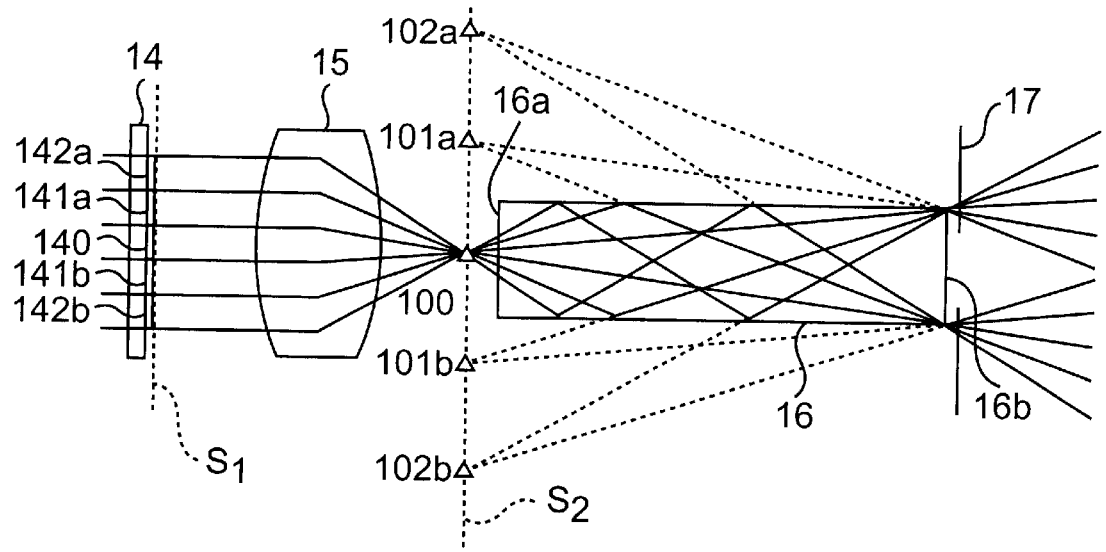
FIGS. 5(a) and (b) are diagrammatic views given in explanation of the relationship between the filter pattern and secondary light source.
Figure 5B:
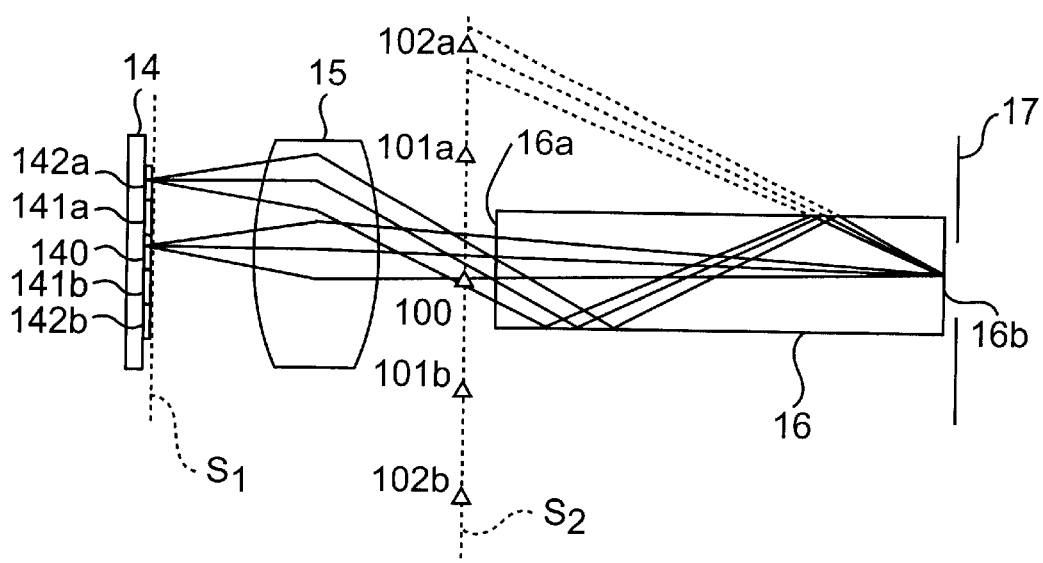

FIG. 5 is a view to explain diagrammatically the relationship between the shape and arrangement of the filter patterns 14A and 14B of FIG. 4 with the plurality of two-dimensional light sources formed by integrator 16. FIG. 5(a) shows the optical path of the illuminating light that exits parallel with the optical axis from filter 14, while FIG. 5(b) shows the optical path of the illuminating light that exits from a point on filter 14.

Filter pattern 140 arranged on filter 14 on the optic axis controls the intensity distribution of optical flux from two-dimensional light source 100 that is not reflected at the internal surface of integrator 16. Also, the pair of filter patterns 141a, 141b that are adjacent on both outer sides of filter pattern 140 control the intensity distribution of optical flux from secondary light source images 101a, 101b that have suffered a single reflection at the internal surface of integrator 16. Furthermore, the pair of filter patterns 142a, 142b that are adjacent on both outer sides of filter patterns 141a, 141b control the intensity distribution of the optical flux from secondary light source images 102a, 102b that have suffered double reflection at the inside surface of integrator 16. With such an arrangement, the transmissivity with regard to the respective optical fluxes of the plurality of light sources formed by integrator 16 can be independently controlled.

These filter patterns 140, 141a, 141b, 142a, 142b are arranged in the vicinity of plane S1 that is conjugate with the emission plane 16b of rod-type integrator 16; furthermore, the magnification factor of condensing lens 15 corresponds to the ratio of the size of emission plane 16b of integrator 16 and the size of filter patterns 140 to 142b. Consequently, the shape of a single filter pattern corresponds to an illumination region on mask M or wafer W of FIG. 1, and the transmissivity distribution of filter patterns 140 to 142b is reflected in the illumination distribution of the illumination regions on wafer W.

FIG. 5 explains diagrammatically the shape and arrangement of filter patterns; the density of arrangement of the filter patterns is lower than in the case of the embodiment of FIG. 4. In this case, insofar as filter pattern 140 is arranged in the middle, it corresponds to filter patterns 14A of FIG. 4 and insofar as filter patterns 142a, 142b are arranged at the periphery, they may be considered as corresponding to filter patterns 14B of FIG. 4.

Returning to the description of FIG. 4, the periodicity with which filter patterns 14A and 14B are arranged is determined by the following condition. Specifically, if the magnification factor from emission plane 16b of integrator 16 to the plane S1 that is conjugate therewith is β and assuming that there is no distortion between emission plane 16b and conjugate plane S1, and that the dimensions of the rod cross section of integrator 16 are (Lx, Ly), the periodicity of the filter patterns 14A, 14B is (βLx, βLy). However, if there is distortion between emission plane 16b and conjugate plane S1, the arrangement of the filter patterns may not necessarily have fixed periodicity. In this case, since it is necessary to arrange the filter patterns in positions corresponding to the two-dimensional light sources to which each filter pattern corresponds, the pattern arrangement must be compensated in accordance with the amount of distortion. Also, in this case, since the shape of the filter patterns itself also undergoes the effect of distortion, the shape must be altered in accordance with the position in which the patterns are arranged. Consequently, an arrangement of the optical system such that there is no distortion between emission plane 16b and conjugate plane S1 is preferable from the point of view of ease of design of the filter patterns, since it enables the shape and arrangement of the filter patterns to be determined by the paraxial magnification factor β between the emission plane 16b and conjugate plane S1.

Filter 14 is realized by a fine dot pattern of thin metallic film such as for example Cr, Ni, or Al; the transmissivity distribution of filter patterns 14A, 14B is controlled by varying the density of this dot pattern. The transmissivity of the metallic thin film itself need not necessarily be 0% and if it is desired to raise the transmissivity of filter patterns 14A, 14B, the transmissivity of the metallic thin film itself may be raised. If, as in the former case, the transmissivity distribution is controlled by the density of the dot pattern, if there is a precise arrangement of filter patterns 14A, 14B on plane S1 that is conjugate with the emission plane 16b of integrator 16, since emission plane 16b and wafer W are conjugate, there is a risk that the shape of the dots of the dot pattern itself will be transferred onto the wafer W. Accordingly, in this embodiment, transfer of the dots themselves is prevented by arranging filter patterns 14A, 14B in a position slightly defocused from the plane S1 conjugate to emission plane 16b. However, in some cases a construction may be adopted such that emission face 16b is deliberately offset from the conjugate plane of wafer W, with the object of preventing transfer onto wafer W of the image of dirt, if there should be adhesion of dirt to the emission face 16b; in such cases, filter patterns 14A, 14B can be arranged so as to be precisely conjugate with emission plane 16b of integrator 16. In other words, filter patterns 14A, 14B may be arranged in a plane that is not perfectly conjugate with wafer W, but in its vicinity. In contrast, if the transmissivity of filter patterns 14A, 14B is controlled by means for example of the film thickness of thin metallic film or a dielectric film rather than a dot pattern, there is no problem even if filter patterns 14A, 14B are arranged in a position conjugate to wafer W. If the size of the dot pattern formed in filter patterns 14A, 14B is too large, there is a risk of the dot pattern being transferred onto wafer W; on the other hand, if it is too small, there is the problem that efficiency is lowered since the diffraction angle produced by the dot pattern becomes large. In view of the above circumstances, the size of the dot pattern is suitably in the range 1 μm to 100 μm.

Figure 6A:
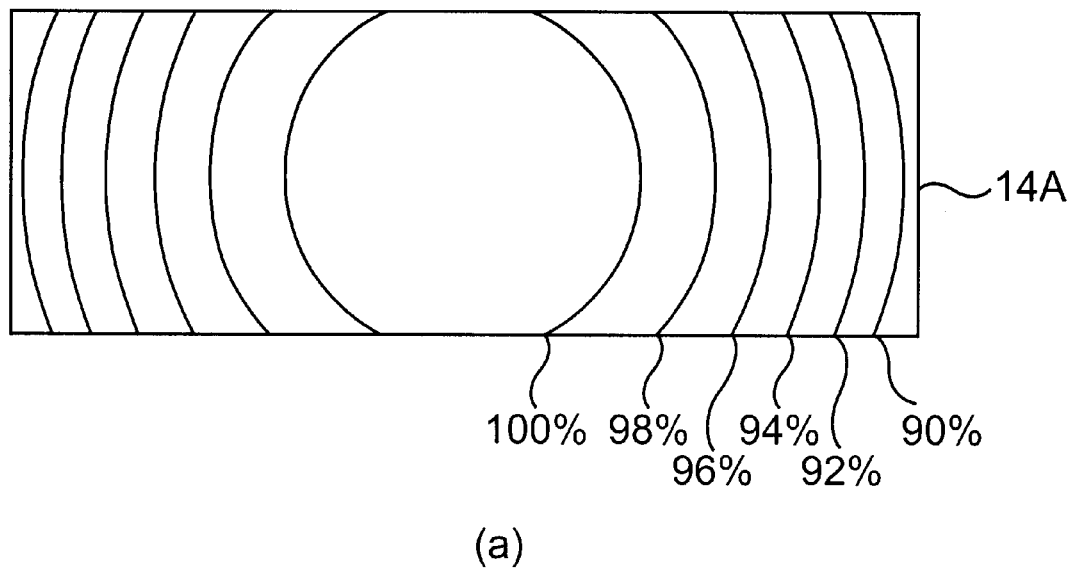
FIGS. 6(a) and (b) are views given in explanation of two types of filter pattern with which the filter is provided.
Figure 6B:
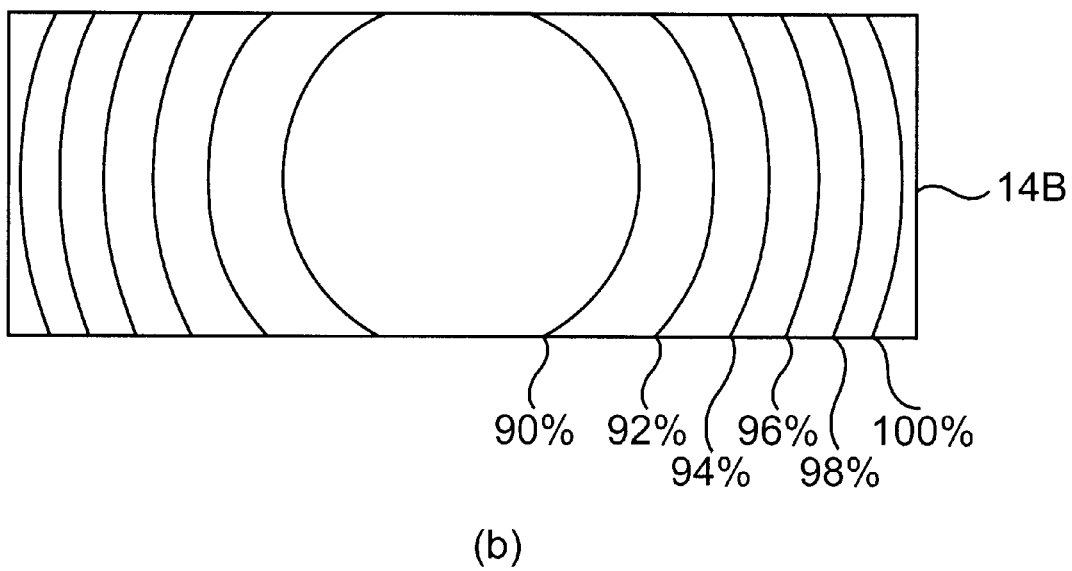

FIG. 6 illustrates an example of the transmissivity distribution of the filter patterns 14A, 14B shown in FIG. 4. FIG. 6(a) shows the transmissivity distribution of filter patterns 14A, while FIG. 6(b) shows the transmissivity distribution of filter patterns 14B. In filter patterns 14A that are arranged in the middle of filter 14, for example a dot pattern is formed (see FIG. 6(a)) whose transmissivity at the center is higher than that at the periphery, while in filter patterns 14B that are arranged at the periphery of filter 14, for example a dot pattern is formed (see FIG. 6(b)) whose transmissivity at the center is lower than that at the periphery.

If the pattern arrangement shown in FIG. 4 and FIG. 6 is adopted, if the diameter of the aperture stop of the illuminating light IL is small (for example when the aperture stop 19a in the turret plate 19 of FIG. 2 is on the optical path), the illuminating light passing through filter pattern 14A becomes dominant; the illumination on wafer W has a distribution reflecting the transmissivity of filter pattern A, showing a tendency to be higher in the central part of wafer W than in the peripheral part of wafer W. Also, in the case where the diameter of the aperture stop of the illuminating light IL gradually becomes larger (in the case where for example aperture stop 19b in the turret plate 19 of FIG. 2 is on the optical path), the illuminating light passing through filter patterns 14B is increased, with the result that the effect of the transmissivity distribution of the filter patterns 14B gradually becomes larger. That is, as the diameter of the aperture stop of turret plate 19 arranged on the optical path gets larger, the illumination of wafer W tends to be higher in the peripheral region than in the central region; contrariwise, as this aperture stop diameter gets smaller, the illumination on wafer W tends to become higher in the central region than in the peripheral region. This means that the illumination distribution on wafer W can be suitably changed in accordance with the diameter of the aperture stop of the illuminating light by adopting a pattern arrangement as described above in filter 14.

Utilizing this in the opposite way, even if, for some reason, such as unevenness of the transmissivity of the illuminating optical system etc., the illumination distribution on wafer W is different depending on the shape of the aperture stop it is possible to achieve an illumination distribution that does not depend on the shape of the aperture stop by canceling this illumination distribution. That is, it is possible to cancel the phenomenon of the illumination distribution on wafer W being different for different shapes of the aperture stop, by arranging on filter 14 suitable filter patterns that compensate for changes in the illumination distribution on wafer W produced by alteration of the aperture stop. Thus, by positively controlling the illumination distribution when the shape of the aperture stop is changed, an illuminating light optical system etc. can be constituted wherein there is no change in the illumination distribution even though the shape of the aperture stop is changed, thereby making it possible to increase the accuracy of transfer of fine patterns.

Positively controlling the illumination distribution in this way can be achieved not merely by advancing or retracting a single filter 14 into the optical path of the illuminating optical system in accordance with the condition of pattern etc. of mask M but also by preparing a plurality of filters of different filter patterns and suitably changing these filters in accordance with the type etc. of pattern of mask M and/or changes in the illumination distribution on wafer W. If this is done, the type of mask M detected using illumination sensor 67 and/or the illumination distribution on wafer W and distribution of the pupil shape may be employed as the criteria for the decision regarding filter replacement.

In the above first embodiment, since changeover of aperture stops 19a to 19f is effected by rotation of turret plate 19, even if the number of aperture stops is increased, the diameter of the aperture stops of the illuminating light IL changes in discontinuous manner. By employing a stop in which the diameter of the aperture is continuously changed, instead of a turret plate 19, the diameter of the aperture stop of the illuminating light IL can be changed in a continuous manner.

[Second embodiment]

The exposure apparatus of the second embodiment is a modified example of the first embodiment. The construction of the exposure apparatus as a whole is the same as that shown in FIG. 1.

In the case of the second embodiment, the pupil shape of the illuminating light at each image height on wafer W is independently controlled for each image height. It should be noted that, in this context, the term "image height" is not used in the narrow sense of the distance from the optic axis, but rather means the two dimensional coordinates on the surface of wafer W.

In the apparatus of this second embodiment also, filter 14 is employed in the same way as illustrated in FIG. 5. However, as the central filter pattern 140, a pattern is adopted as shown in FIG. 6(a) such that the transmissivity in the middle is higher than that at the periphery, while, as the peripheral filter patterns 142a, 142b, as shown in FIG. 6(b) a pattern is adopted such that the transmissivity in the middle is lower than that in the peripheral region, and for the intermediate filter patterns 141a, 141b, a pattern is adopted having uniform transmissivity. In this case, filter patterns 140, 141a, 141b, 142a, 142b control the intensity distribution of optical flux from the respective two-dimensional light sources 100, 101a, 101b, 102a, and 102b.

Figure 7:
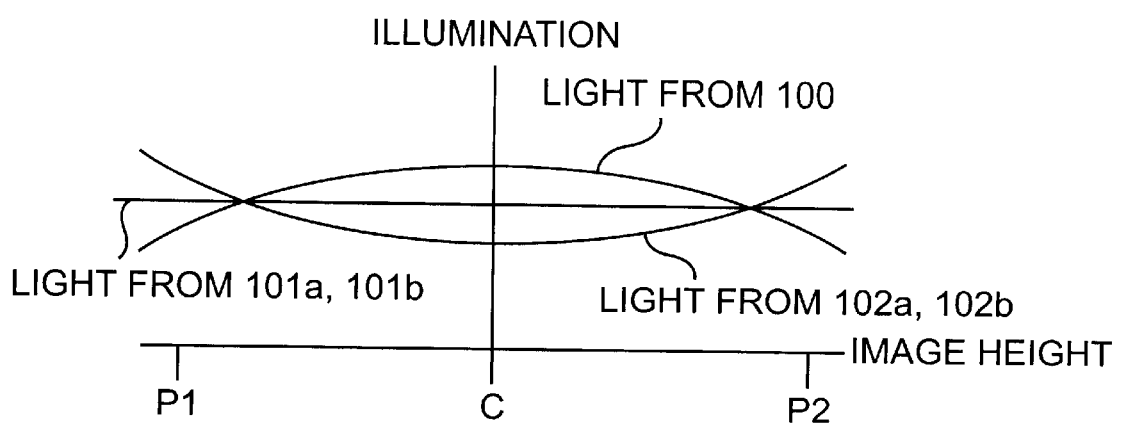
FIG. 7 is a graph illustrating the illumination distribution on the wafer in the case of a second embodiment.

FIG. 7 shows the illumination distribution on wafer W. On wafer W, there is overlaid an illumination distribution in accordance with filter patterns 140, 141a, 141b, 142a, 142b. In this case, whereas, at the central position C on wafer W, the light from two-dimensional light source 100 is more strongly observed than the light from two-dimensional light sources 102a, 102b, in the case of positions P1 and P2 remote from the center of wafer W, on the contrary, light from secondary light source 100 is observed as being weaker than light from secondary light sources 102a, 102b.

That is, the illumination distribution when the illuminating light that is supplied onto wafer W from the two-dimensional light sources 100, 101a, 101b, 102a, 102b is added practically uniform.

Figure 8A:
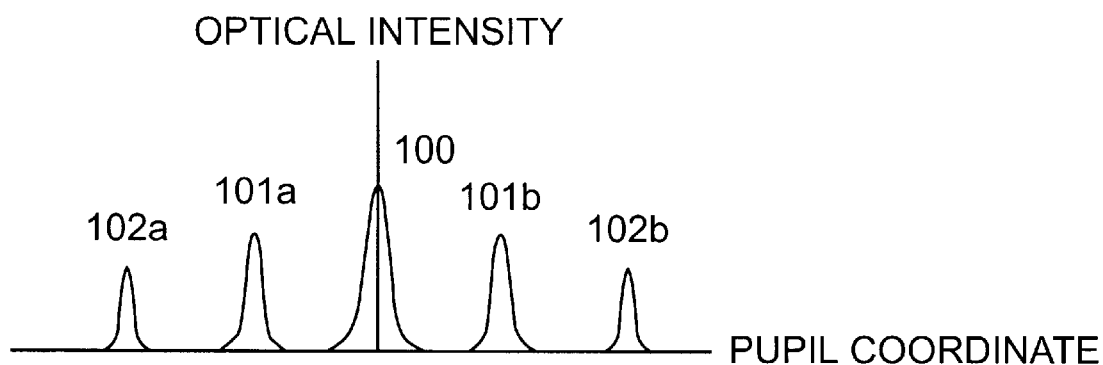
FIGS. 8(a) and (b) are graphs given in explanation of the pupil shape of the illuminating light of FIG. 7.
Figure 8B:
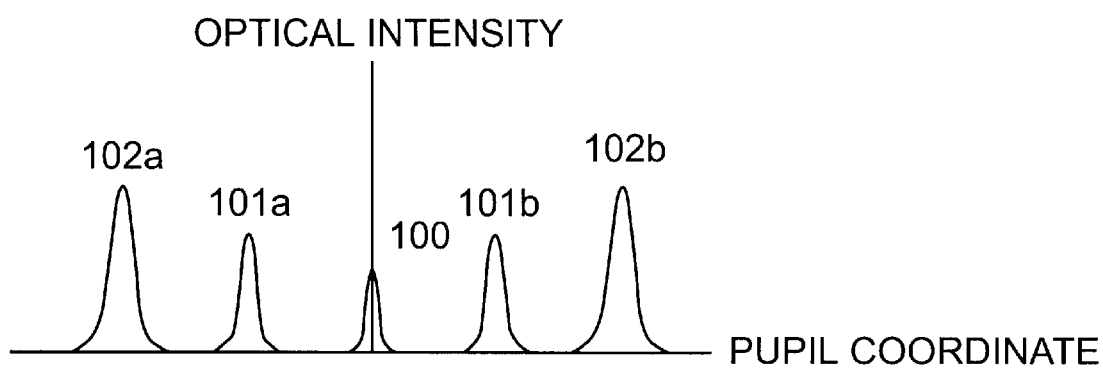

In contrast, when seen from the center C on wafer W, as shown in FIG. 8(a), the intensity of the two-dimensional light source image at the central part at pupil coordinates parallel to the optic axis is greater than the intensity of the two-dimensional light source images in the peripheral part at pupil coordinates making a large angle with respect to the optic axis. And, when seen from the periphery P1, P2 on wafer W, as shown in FIG. 8(b), the intensity of a two-dimensional light source image at the periphery making a large angle with respect to the optic axis is greater than the intensity of a two-dimensional light source image in the central region parallel to the optic axis. By utilizing this phenomenon, positive control of the pupil shape such as to form any desired secondary light source distribution at any desired point on wafer W can be achieved by arranging a suitable filter pattern on filter 14. That is, it becomes possible to independently control, in respect of each image height, the shapes (coherence factors) of two-dimensional light sources at arbitrary image height on the surface of wafer W. The transfer accuracy of fine patterns can thereby be increased.

[Third embodiment]

An exposure apparatus as claimed in the third embodiment is a modified example of the first embodiment.

The construction of the exposure apparatus as a whole is the same as that illustrated in FIG. 1.

Although, in the practical example of FIG. 6 of the first embodiment, a filter pattern is illustrated which is rotationally symmetric, the invention is not restricted to this, and a filter pattern could be employed having a rotationally asymmetric distribution. If such a filter pattern is employed, any desired illumination distribution can be formed at any desired two dimensional point on wafer W.

Figure 9:
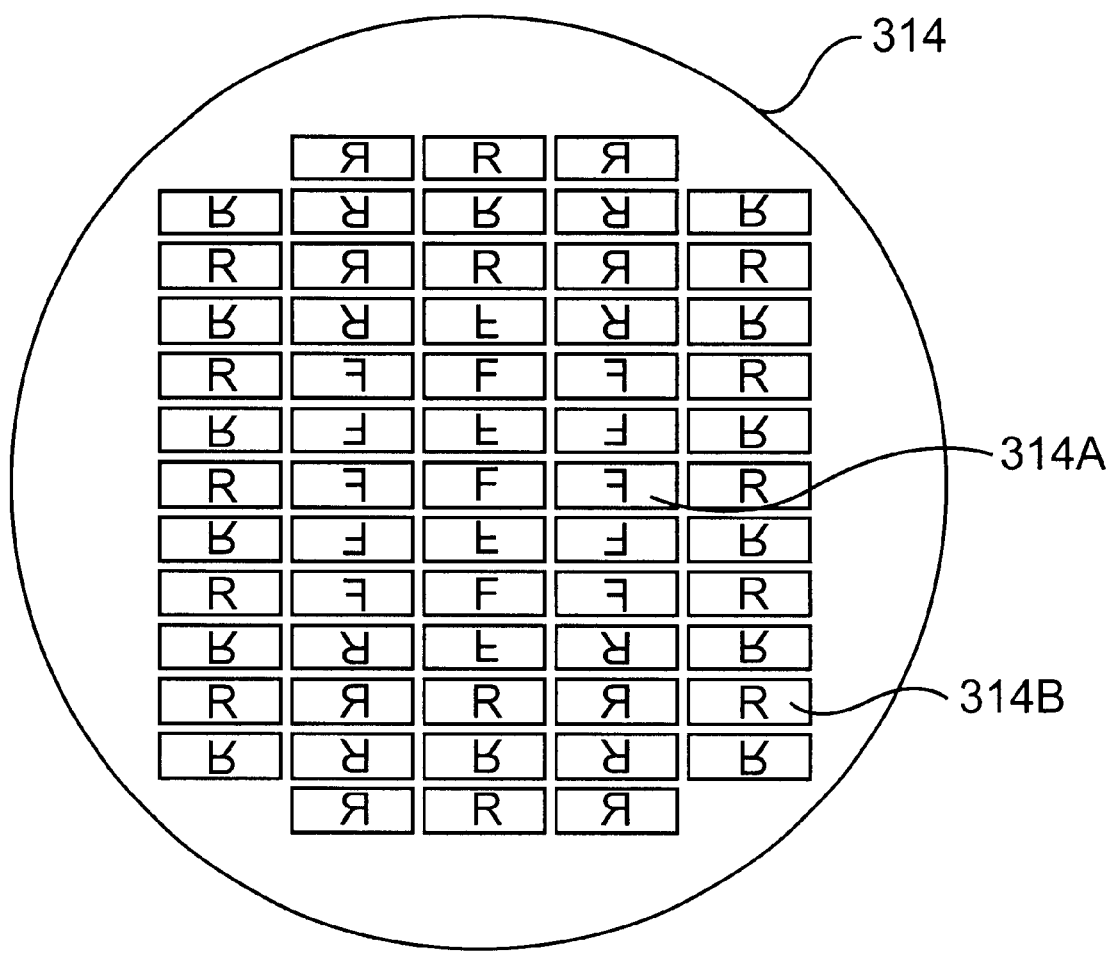
FIG. 9 is a view given in explanation of a method of pattern arrangement of the filter of a third embodiment.

FIG. 9 is a view given in explanation of a method of arranging filter patterns 314F and 314R of filter 314 in the case of a third embodiment. In the case of the rod-type integrator 16, since the optical flux from adjacent two-dimensional light sources is inverted, if the filter patterns 314F, 314R of filter 314 are rotationally asymmetric as in the third embodiment, adjacent filter patterns may be arranged to constitute mirror images of each other, as shown in the drawing. The letters F, R that are affixed at the positions of filters 314F, 314R indicate that there are two types of transmissivity distribution at the center and at the outside of filter 314. The rotational position of letters F, R indicates the direction of asymmetry.

[Fourth embodiment]

An exposure apparatus as claimed in a fourth embodiment is a modified example of the first to third embodiments. The basic construction of the exposure apparatus as a whole is the same as that illustrated in FIG. 1.

An object of this embodiment is to obtain even more uniform illumination than that of the embodiments described above.

Figure 10:
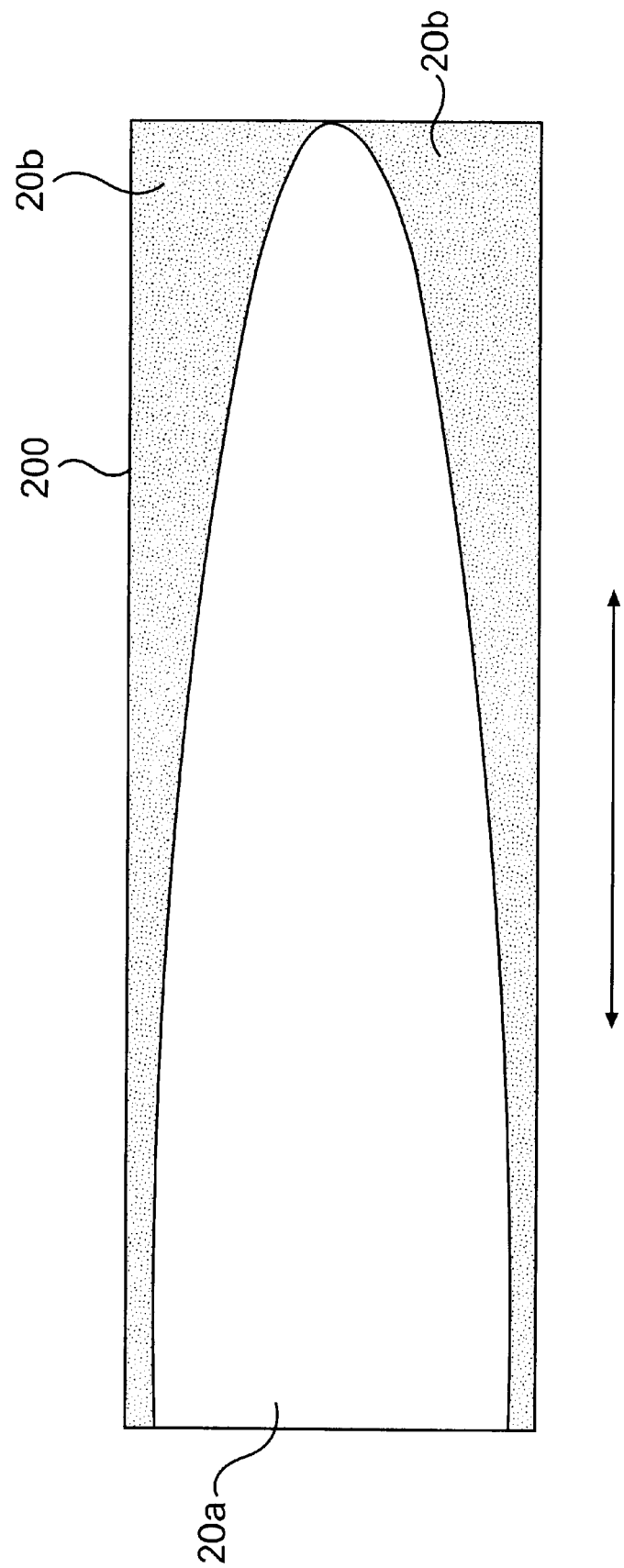
FIG. 10 is a view given in explanation of a flare stop plate as claimed in a fourth embodiment.
Figure 11:
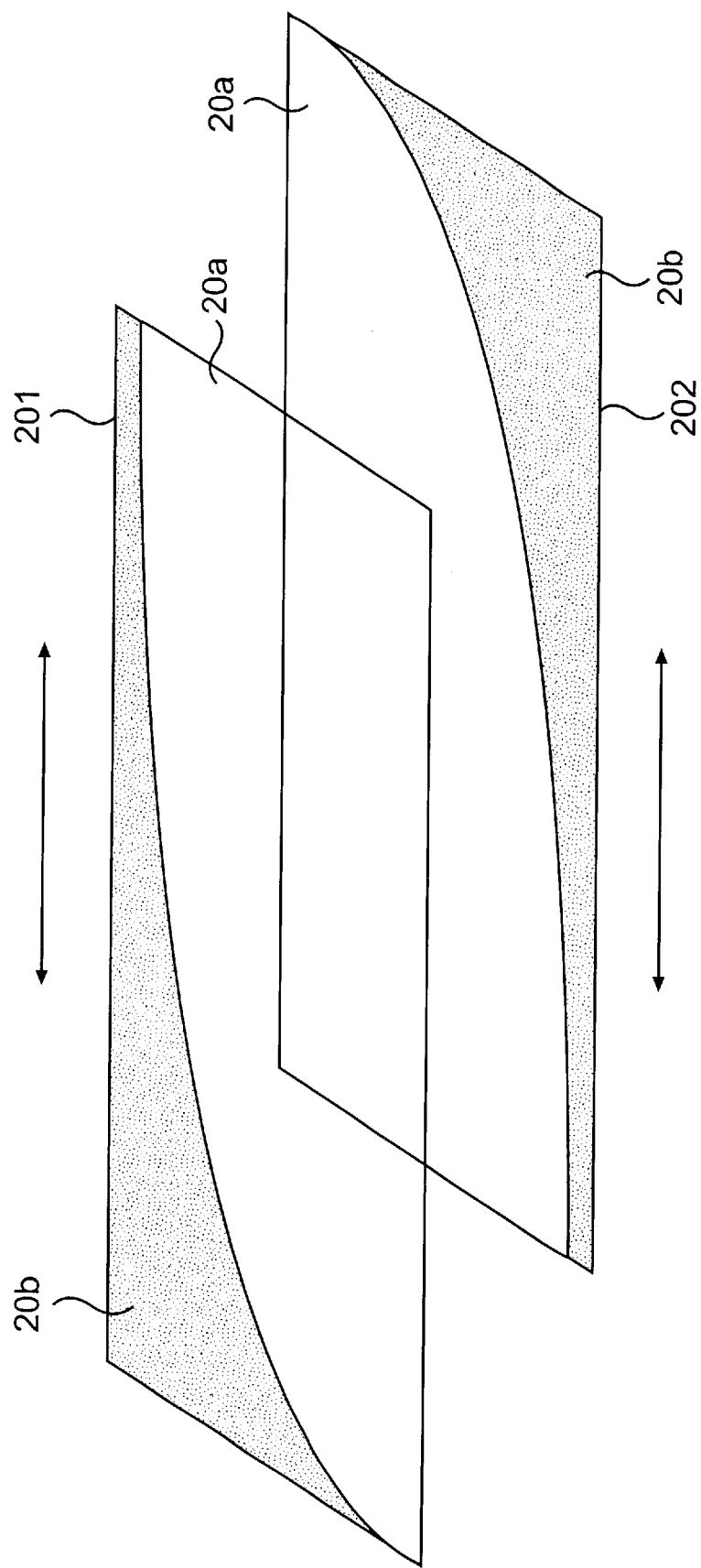
FIG. 11 is a view given in explanation of another flare stop plate as claimed in the fourth embodiment.

In order to implement this, on the emission plane 16b of integrator 16 there is arranged a flare stop plate 200 as shown in FIG. 10 or flare stop plate 201 and 202 as shown in FIG. 11. These flare stop plates comprise a transparent part 20a that transmits light and an opaque part 20b that stops light. These flare stop plates can be displaced in the directions of the arrows in the drawing. By displacing the flare stop plates in this way in the directions of the arrows, adjustment to the desired illumination distribution can be achieved. The two types of flare stop plate shown in FIG. 10 and FIG. 11 are preferably applied to an exposure apparatus of the step and scan type, in particular; in this case, the scanning direction of the exposure apparatus is the same as the direction of the arrows in both drawings.

The flare stop plate 200 illustrated in FIG. 10 is constituted by a single plate. In contrast to this, the flare stop plate shown in FIG. 11 is constituted by two plates, namely, plate 201 and 202. The degrees of freedom for the illumination distribution adjustment can be increased compared with the flare stop plate shown in FIG. 10 by asymmetric movement of the respective plates.

In the case of this embodiment, these plates were arranged on emission plane 16b of integrator 16, but the same effect is obtained by arranging these at any location so long as it is conjugate with emission plane 16b of integrator 16.

Also, opaque part 20b of the flare stop plate is not restricted to being completely opaque (i.e. transmissivity 0%), so long as it shows reduced transmissivity.

[Fifth embodiment]

An exposure apparatus as claimed in a fifth embodiment is a modified example of the first to third embodiments. The basic construction of the exposure apparatus as a whole is practically the same as that illustrated in FIG. 1. Consequently, in FIG. 12, structural elements that are the same as in the first embodiment are given the same reference symbols as in the case of FIG. 1.

An object of this embodiment is to obtain even more uniform illumination than in the case of the first to third embodiments.

Figure 12:
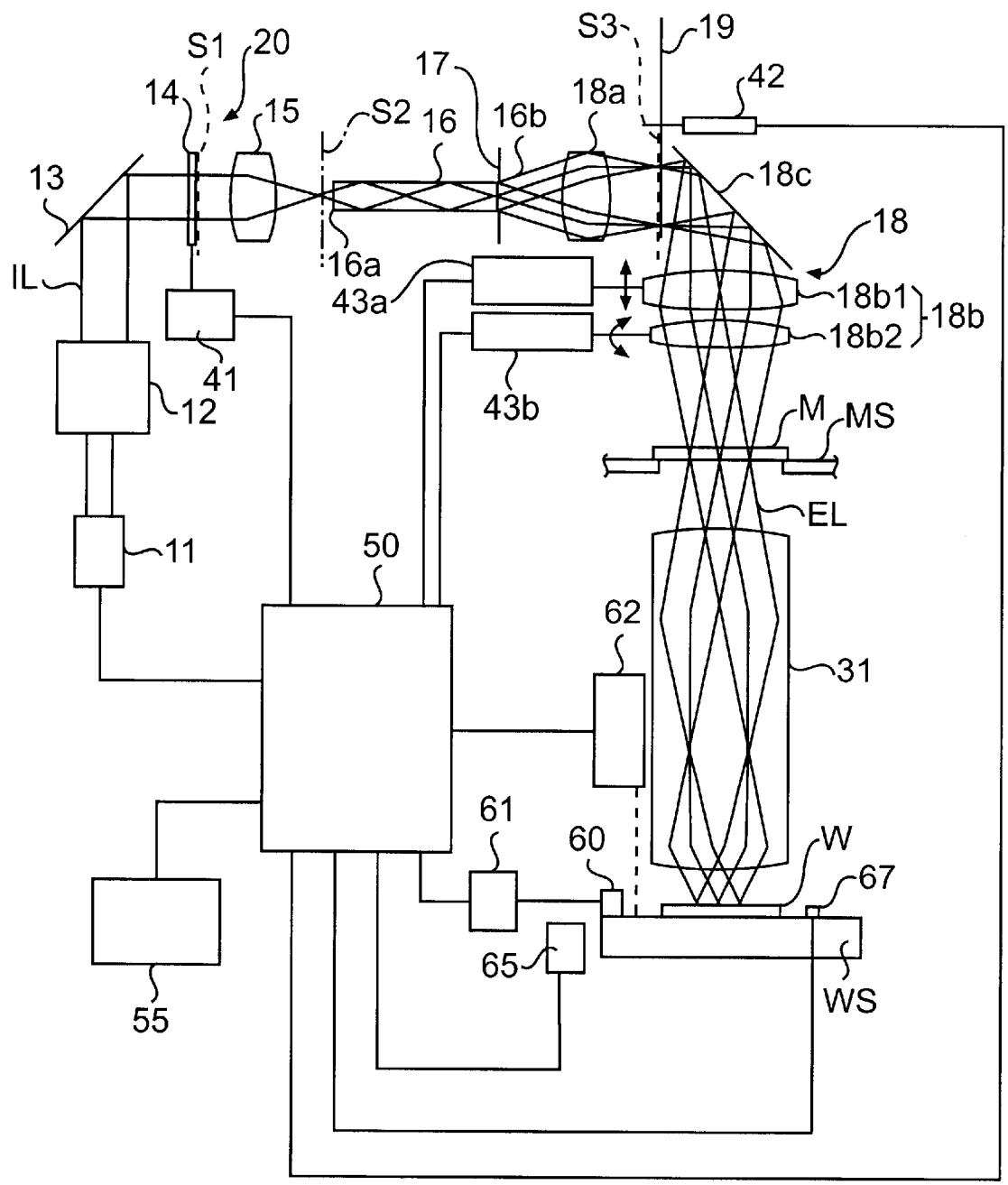
FIG. 12 is a diagram given in explanation of the construction of an exposure apparatus as claimed in a fifth embodiment.

FIG. 12 illustrates diagrammatically the construction of an exposure apparatus as claimed in the fifth embodiment of the invention.

The difference between this embodiment and the first embodiment is that the rear group 18b of the relay optical system is constituted by a first component 18b1 and a second component 18b2, a first drive means 43a and a second drive means 43b being respectively connected to first component 18b1 and second component 18b2. First drive means 43a and second drive means 43b are connected to a controller 50. The first drive means 43a and second drive means 43b are motors.

Figure 13:
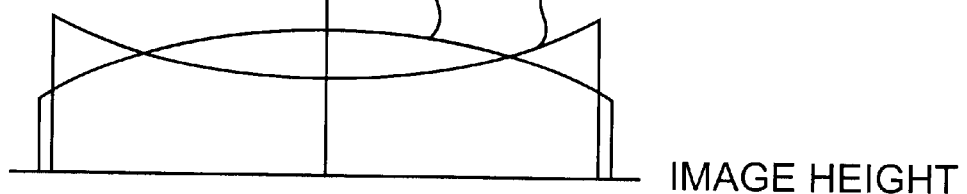
FIG. 13 is a view illustrating changes of illumination distribution produced by displacement of the front group $18b1$ of the relay optical system.
Figure 14:
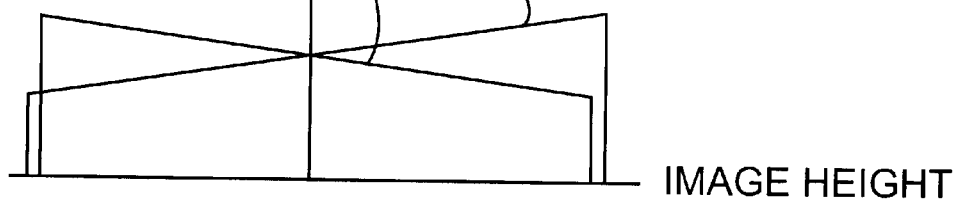
FIG. 14 is a view illustrating changes of illumination distribution produced by tilting of the rear group $18b2$ of the relay optical system.

First component 18b1 is displaceable in the direction of the optic axis, being arranged to be driven by first drive means 43a. When first component 18b1 is displaced, as shown in FIG. 13, it is capable of generating a "concave/convex" component of the illumination irregularity In contrast, the second component 18b2 is constructed so that it can be driven by second drive means 43b so that it can be tilted with respect of the optic axis. When the second component 18b2 is tilted, as shown in FIG. 14, it can generate a graded component of the illumination irregularity. This tilting mechanism holds the rotary shaft biaxially, having a construction that is capable of tilting this in any direction with respect to the optic axis. Instead of tilting, the same effect can be obtained by shifting, as another form of eccentricity, i.e. by displacing in the direction perpendicular to the optic axis of relay optical system 18. In this case, the power layout of relay optical system 18 and the position of the rotary axis of tilting are arranged to be such that the variation of telecentricity on the wafer surface produced by the displacement of the first component 18b1 and second component 18b2 does not present a practical problem.

In this embodiment, since the illumination irregularity is regulated by displacement of the first component 18b1, which is part of the relay optical system constituting an optical member having refraction power, or the eccentricity of second component 18b2, unlike the case where regulation is achieved by the transmittance of the filter etc., there is no loss of the quantity of light.

If for example it is assumed that good illumination uniformity is obtained when the aperture stop of 19b of FIG. 2 is arranged as the aperture stop, when the aperture stop is altered to the aperture stop of 19c of FIG. 2, there is a possibility that illumination irregularity with a concave/convex component and graded component may be generated by the characteristics of the optical system.

In order to compensate for such illumination irregularity, this embodiment is so constructed that excellent uniformity of illumination can be maintained by respectively compensating the concave/convex component or the graded component of the illumination irregularity by displacement of the first component 18b1 of relay optical system 18 described above in the optic axis direction or tilting of the second component 18b2.

The amount of illumination irregularity generated is measured by illumination sensor 67. At this point, the amount of displacement of the first component 18b1 and the amount of tilt of the second component 18b2 are set by controller 50, and the illumination irregularity is compensated by driving respectively the first component 18b1 and second component 18b2 by first drive means 43a and second drive means 43b.

When performing this compensation, an excellent compensated condition of the illumination uniformity can be achieved by repeated measurement, control and drive until the illumination uniformity is brought within a predetermined restricted range.

Also, the method may be adopted of ascertaining and storing beforehand for each aperture stop the optimum positions of first component 18b1 and second component 18b2 for the change of illumination irregularity produced by alteration of the aperture stop, and effecting drive to the stored position in a manner linked with the alteration of the aperture stop. This is excellent in view of speed in that there is no need for repeated drive in response to the measured value obtained by the illumination sensor 67, but resetting is necessary if for some reason the change of illumination irregularity produced by alteration of the aperture stop alters.

In this embodiment, the second component 18b2 is arranged to be tiltable, but, depending on the construction of the optical system, the same effect could be obtained even by shifting. In this case, in order to reduce the variation of telecentricity on the wafer produced by shifting, a construction is even more preferred in which shifting is performed by two or more lenses in at least two or more different directions.

In this embodiment, compensation is performed of the illumination irregularity produced by alteration of the shape of the secondary light sources. However, it is possible to compensate for illumination irregularity produced by factors other than this, such as for example change of illumination irregularity produced by factors such as changes due to light source replacement or maintenance or secular changes such as change of the transmittance of the optical system.

In this embodiment, it was assumed that the condition in which there is little illumination irregularity of the wafer W surface is the condition in which there is good uniformity of illumination. However, there is no restriction to this, and in some cases, depending on the mask pattern and/or conditions of the optical system, it may be preferable for example for the illumination in the peripheral region to be higher than that in the center, or lower. In such cases also, with the present embodiment, control to the desired illumination distribution can be achieved.

Also, although a construction was described in which the first component 18b1 was displaced in the optic axis direction while the second component 18b2 was moved off-center, it would be possible for the opposite arrangement to be employed, in which the first component 18b1 is moved off-center while the second component 18b2 is displaced in the optic axis direction.

Furthermore, although, in this embodiment, the rear group 18b of the relay optical system was displaced, the same effect could be obtained by similarly tilting condensing lens 15 or displacing it in the optic axis direction.

The invention was described above with reference to embodiments, but the invention is not restricted to the above embodiments. For example, although, in the above embodiments, as the rod-type optical integrator, an integrator 16 is employed consisting of a rod of rectangular cross section, the cross-sectional shape is not restricted to this, and an integrator having another cross-sectional shape such as hexagonal could be employed. In this case, it is desirable, from the point of view of efficient utilization of the illuminating light, that the respective filter patterns formed on the filter 14 etc. should be closely similar to the cross-sectional shape of the rod-type optical integrator.

Since, with the illumination apparatus described above, the optical intensity distributions at a large number of light source images are respectively independently controlled by illumination control means arranged on the light source side of a rod-type optical integrator, the condition of the light that is supplied to the illuminated surface from the light source images can be easily and precisely controlled. Consequently, illumination conditions such as the illumination distribution and/or the pupil shape over the illuminated surface can be regulated to the desired condition.

What is claimed is:

1. An illumination apparatus, comprising:

a rod-type optical integrator forming a plurality of light source images from light from a light source;

a relay optical system illuminating a surface to be illuminated by condensing light from said plurality of light source images formed by said rod-type optical integrator; and illumination control means positioned between said light source and said rod-type optical integrator, said illumination control means independently controlling an intensity of each of said plurality of light source images formed by said rod-type optical integrator and thereby controlling an intensity distribution of the light on said surface to be illuminated.

2. The illumination apparatus as claimed in claim 1, wherein a condensing optical system positioned between said illumination control means and said rod-type optical integrator directs light through said illumination control means to said rod-type optical integrator;

said illumination control means include an optical filter independently controlling a transmittance distribution of each of said plurality of light source images; and said optical filter is provided in a position substantially optically conjugate with said surface to be illuminated, in relation to said condensing optical system, said rod-type optical integrator and said relay optical system.

3. The illumination apparatus as claimed in claim 1, wherein a flare stop plate is provided at an emission plane of said rod-type optical integrator or in a position conjugate to the emission plane.

4. The illumination apparatus as claimed in claim 1, further comprising drive means to move part of said relay optical system.

5. The illumination apparatus as claimed in claim 2, wherein a flare stop plate is provided at an emission plane of said rod-type optical integrator or in a position conjugate to the emission plane.

6. The illumination apparatus as claimed in claim 5, further comprising drive means to move part of said relay optical system.

7. An exposure apparatus, comprising:

a rod-type optical integrator forming a plurality of light source images from light from a light source;

a relay optical system illuminating a mask by condensing light from said plurality of light source images formed by said rod-type optical integrator;

a projection system projecting a pattern of said mask onto a photosensitive substrate; and illumination control means positioned between said light source and said rod-type optical integrator, said illumination control means independently controlling an intensity of each of said plurality of light source images formed by said rod-type optical integrator and thereby controlling an intensity distribution of the light on said mask.

8. The exposure apparatus as claimed in claim 7, wherein a condensing optical system positioned between said illumination control means and said rod-type optical integrator directs light through said illumination control means to said rod-type optical integrator;

said illumination control means include an optical filter independently controlling a transmittance distribution of each of said plurality of light source images; and said optical filter is provided in a position substantially optically conjugate with said mask, in relation to said condensing optical system, said rod-type optical integrator and said relay optical system.

9. A method of exposure, comprising the steps of:

forming a plurality of light source images by passing light from a light source through a rod-type optical integrator;

illuminating a mask by condensing light from said plurality of light sources images formed by said rod-type optical integrator;

exposing a pattern of said mask onto a photosensitive substrate; and independently controlling an intensity of each of said plurality of light source images formed by said rod-type optical integrator and thereby controlling an intensity distribution of the light on said mask.

* * * * *

UNITED STATES PATENT AND TRADEMARK OFFICE
CERTIFICATE OF CORRECTION

PATENT NO. : 6,281,967 B1
DATED : August 28, 2001
INVENTOR(S) : Yuji Kudo

It is certified that error appears in the above-identified patent and that said Letters Patent is hereby corrected as shown below:

<u>Title page,</u>
Item [57], ABSTRACT,
Line 7, "above the wafer" should read -- on the wafer; and
Line 8, "the on object" should read -- the above object --.

<u>Column 14, claim 9,</u>
Line 38, "light sources images" should read -- light source images --.

Signed and Sealed this

Twenty-sixth Day of February, 2002

Attest:

Attesting Officer

JAMES E. ROGAN
Director of the United States Patent and Trademark Office